United States Patent [19]

Le Bihan et al.

[11] Patent Number: 4,809,701
[45] Date of Patent: Mar. 7, 1989

[54] METHOD TO MEASURE THE MOLECULAR DIFFUSION AND/OR PERFUSION PARAMETERS OF LIVE TISSUE

[75] Inventors: Denis Le Bihan, Paris; Eric Breton, Voisins Les Bretonneux, both of France

[73] Assignee: Thomson CGR, Paris, France

[21] Appl. No.: 100,261

[22] Filed: Sep. 23, 1987

[30] Foreign Application Priority Data

Sep. 26, 1986 [FR] France ................. 86 13483

[51] Int. Cl.⁴ .............................................. A61B 5/05
[52] U.S. Cl. ................................................... 128/653
[58] Field of Search ................ 128/653, 696; 324/307, 324/309, 306

[56] References Cited

U.S. PATENT DOCUMENTS 4,413,233 11/1983 Fossel et al.
4,424,487 1/1984 Lauffer .................................. 324/307
4,595,879 6/1986 Lent et al. ............................ 324/309
4,712,560 12/1987 Schaefer et al. ..................... 128/653

FOREIGN PATENT DOCUMENTS 0132785 2/1985 European Pat. Off. ............ 128/653
0132975 2/1985 European Pat. Off.

OTHER PUBLICATIONS

Singer, "Nuclear Magnetic Resonance Blood Flow Measurements in the Human Brain", Science vol. 221, Aug. 1983, pp. 654–656.

Mansfield et al., "NMR Imaging in Biomedicine" 1982 pp. 30, 31.

Physics in Medicine & Biology, vol. 30, No. 4, Apr. 1985, pp. 345–349, The Institute of Physics, Bristol, GB; D. G. Taylor et al.: "The Spatial Mapping of Translational Diffusion Coefficients by the NMR Imaging Technique" *Page 345: Introduction; page 349, Lines 6–7*.

Comptes Rednus. Serie C. Sciences Chimiques, vol. 301, No. 15, Nov. 1985, pp. 1109–1112, Academie des Sciences, Paris, FR; D. Le Bihan et al.: "Resonance Magnetique.-Imagerie de Diffusion in Vivo Par Resonance Magnetique Nucleaire" pp. 1111–1112.

Primary Examiner—Ruth Smith
Attorney, Agent, or Firm—Oblon, Fisher, Spivak, McClelland & Maier

[57] ABSTRACT

By synchronizing the radio-frequency excitations of a nuclear magnetic resonance experiment with the heart beat of a patient, notable improvement is obtained in the measurement of the molecular diffusion parameters of the tissues studied. In particular, good images of the brain are obtained in this way: the parameter represented is the molecular diffusion constant.

8 Claims, 1 Drawing Sheet

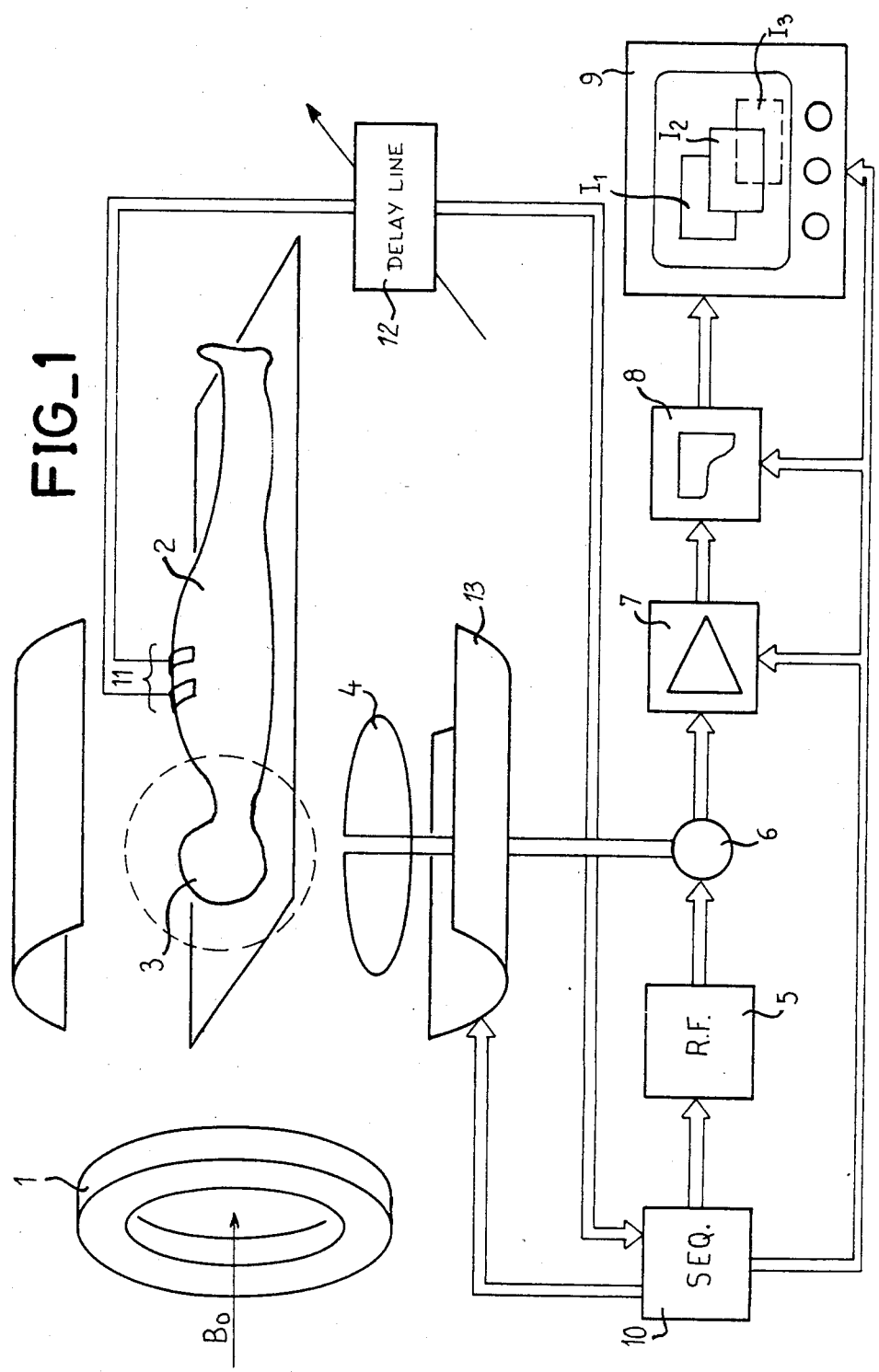
FIG_1

METHOD TO MEASURE THE MOLECULAR DIFFUSION AND/OR PERFUSION PARAMETERS OF LIVE TISSUE

BACKGROUND OF THE INVENTION

An object of the present invention is a method to measure the molecular diffusion and/or perfusion parameters of live tissue. To this end, the tissue is subjected to nuclear magnetic resonance (NMR) experiment. The invention can be applied, more especially, to the field of medicine where experiment of this type is undertaken in diagnosis involving human patients. It can, of course, also be used for animals. It is more especially applied in association with methods for the imaging of the parameter measured. The chief parameters measured are the constant of molecular diffusion and/or the percentage of capillaries perfused, and the measurements are performed chiefly on the brain.

FIELD OF THE INVENTION

During an NMR examination, a body under examination is subjected to the influence of a homogeneous, intense, constant and orientating field. Under this influence, the magnetic moments of the this body's atoms are oriented with this field. Then, while it is subjected to this field, a radio-frequency electro-magnetic excitation is applied to it so as to flip the orientation of the magnetic moments of its atoms. At the end of this flipping process, when the excitation ceases, the magnetic moments tend to be realigned with the constant field by emitting a radio-frequency signal. This signal depends on the intensity of the field and the nature of the particles excited: most of the time, these particles are hydrogen atom protons. The signal emitted is picked up and processed, in particular, so as to extract representative images of cross-sections of the body thus studied.

During the processing operation, specific parameters of the tissues can be differentiated. Conventionally, in the prior art, the density of the excited protons and the relaxation times, spin-spin and lattice-spin of these protons is differentiated with the surrounding material. There are also methods, in the prior art, where it is sought to represent the molecular diffusion constant of the protons concerned as well as the perfusion. The molecular diffusion constant measures the capacity of the protons in question to shift slightly to either side of their position of equilibrium in the atoms of the tissues to which they belong. This measurement of molecular diffusion is in great demand as it makes it possible to make therapeutic decisions on the basis of the results, whereas the measurement of relaxation time does not always make it possible to characterize unhealthy tissues, for example those affected by cancer. Perfusion takes the state of vascularization of the tissue into account.

DESCRIPTION OF THE PRIOR ART

The measurement of the molecular diffusion constant requires two sets of experiments or two sets of measurements, in particular according to information provided in the French Pat. No. 85 09824, filed by the Applicant on June 27, 1985. During a first series of measurements, called less-diffusing measurements, the radio-frequency signals are read in a usual way. During a second series of measurements, called diffusing measurements, additions of constant fields are applied during the experiment, and these are distributed with a linear variation (a gradient) in the volume of tissues under study, so as to weaken the resulting radio-frequency signal. This weakening depends on the shift undergone by the protons during the experiment: it is characteristic of their molecular diffusion constant. For a comparison of the results obtained at the end of the first series with those obtained at the end of the second series, the diffusion constant at each point of the tissue under study can be extracted. The measurement of the perfusion is an improvement of the method. It is described in the European Pat. No. 86 401 423.8 filed by the Applicant on June 27, 1986. In this patent, a third series of measurements is performed, with a diffusing effect different from that of the second series. By comparing the results obtained at the end of the first series with those obtained at the end of the third series, it is also possible to extract the diffusion constant at each point of the tissue under examination. By comparing these two extractions, the percentage of perfused capillaries can be deduced. It is also possible, however, to envisage other methods of measuring the molecular diffusion constant. A description another such method is given, for example, in the article by Mr. WESBY George et al, "Translational Molecular Self-Diffusion in Magnetic Resonance Imaging: Effects and Application", in the journal *Biomedical Magnetic Resonance* Radiology Research and Educational Foundation (San Francisco), 1984. This article suggests measuring the diffusion constant of a tissue by comparing the relative effect of the diffusion in this tissue and in a reference body during different series of excitation sequences.

Whatever the method employed, it was observed that, despite all the precautions taken neither were the measurements absolutely precise, nor were the images perfectly sharp. It was thought that these faults might be attributed to the instruments used to apply the gradients. It was thought that, during the experiments, these instruments were not stable and did not make it possible to subject the tissues under study to comparable strains, as a result of which these tissues restored signals that changed in the course of series of radio-frequency excitations. It was also thought that the very nature of the tissues examined, namely vascularized human tissues, could be the cause of these faults. In particular, turbulence phenomena in the flow of blood through the capillaries could create artefacts capable of disturbing the images.

In fact, it was observed in the invention that the blood vessels and the surrounding tissues, like the entire brain itself, are animated by movements synchronized with heart beats and that these movements are sufficient to introduce major artefacts into the diffusion and/or perfusion imaging sequences. These problems were dealt with in an especially simple and effective way. The application of the radio-frequency excitations and, in a corresponding way, the measurement of the signals picked up, were synchronized with the patient's heart beat. In making this synchronization, it was ensured that the signals would be picked up always under the same conditions. The result was an immediate and very appreciable improvement in the results. The molecular diffusion images become sharp and can be used to take sure decisions by specifying the contours and extent of the affected zones.

SUMMARY OF THE INVENTION

The invention pertains to a method to measure the molecular diffusion and/or perfusion parameters of a live tissue of a patient using an NMR experiment, comprising at least one series of radio-frequency excitation sequences of this tissue, a method wherein the excitations are synchronized with the cardiac rhythm of the patient.

BRIEF SUMMARY OF THE DRAWINGS

The invention will be better understood from the following description and the appended figure. These are given solely by way of indication and in no way limit the scope of the invention. The single FIG. 1 is a schematic drawing of a machine which can be used to apply the method according to the invention.

DESCRIPTION OF THE PREFERRED EMBODIMENT OF THE INVENTION

FIG. 1 thus shows an NMR machine comprising means 1 to subject a body to be examined 2 to an intense, constant, and homogeneous magnetic field $B_0$. In one particular example, the body 2 is that of a patient and, in one particular example, it is sought to represent the phenomena that occur in his brain 3. The machine further comprises a radio-electrical antenna 4 connected to a radio-frequency excitations emitter 5 to flip the orientation of the magnetic moments of the protons of the body 2. The antenna 4 can also be used to pick up the de-excitation signal restored by these protons at the end of the excitations. Using a duplexer 6, the signal picked up is routed to receiving and measuring means 7. The measured signal is then processed in processing means 8. These means may, if necessary, be connected to means 9 for the display of a cross-section of a part 3 of a body 2 under examination. Together, these means are known and function in a usual manner, under the control of a sequencer 10. During the sequences, additional encodings are applied by encoding means comprising, in particular, coils 13 known as gradient coils.

In an example of an experiment envisaged, the body 2 is subjected to at least two series of excitations. During a first, so-called less-diffusing series of excitations an image Il of the concerned part of the body 2 is acquired in a usual manner. During a second series of so-called diffusing excitations, a second image $I_2$ of the same parts of the body 2 is obtained. During both series of excitations, the characteristics of the excitation sequences are similar, apart from the addition, during the diffusing excitations, of additional and bipolar pulses with a constant field gradient. If each sequence of this series comprises several spin echo excitations, their number may differ from one series to another. Apart from this difference, the two images $I_1$ and $I_2$ are acquired under the same conditions: in particular, the duration of each excitation-measurement stage is exactly the same, the number of excitations in each series is the same and the repetition time between successive excitation sequences in a series is the same in both series. If $S_1$ and $S_2$ are results of measurements, representative of the images $I_1$ and $I_2$ respectively at one and the same point, it has been established, in the patent application referred to above, that the molecular diffusion constant relating to this point is proportionate to the logarithm of the ratio $S_2/S_1$. The coefficient of proportion depends solely on the shape of the additional gradients during the diffusing excitation sequences.

The characteristic feature of the present invention is that, for each sequence of each series in the experiment, the sequencer initializes the excitation in synchronization with the patient's heart beat. For this purpose, a detector 11 of this heart beat is connected to a synchronization input of the sequencer 10. With the cardiac cycle thus taken into account, it is possible to synchronize the system with respect to any specific time of this cardiac cycle, especially by means of a line with an adjustable time-delay 12. In a preferred way, steps are taken to trigger the excitations and to start their measurement at the end of a constant period depending on the shape of the excitation chosen, at moments when the tissue to be imaged, namely the brain, is as immobile as possible. Thus, the method is free of the corresponding variation of the parameter measured: the images $I_3$, obtained by comparing the images $I_1$ with the images $I_2$, are then free of artefacts. The invention is, of course, applicable to all other methods for the measurement of the molecular diffusion constant as well as to methods for measuring blood perfusion. In other words, once there are series of excitations, these excitations must be synchronized.

What is claimed is:

1. A method to measure the molecular diffusion parameters of a live and resting tissue of a patient using an NMR experiment, comprising at least one series of radio-frequency excitation sequences of said tissue, each sequence being followed by measurements of a NMR signal resulting from said excitations, said NMR signals being then processed for giving said molecular diffusion parameters, wherein the excitations are synchronized with the cardiac rhythm of the patient.

2. A method according to the claim 1, wherein the measurement comprises an imaging of the parameters.

3. A method according to the claim 1, wherein one of the parameters is the molecular diffusion constant.

4. A method according to the claim 1, wherein the tissue is the tissue of the patient's brain.

5. A method according to the claim 1, wherein the excitations are synchronized with selected instants of the patient's heart rhythm.

6. A method according to the claim 1 wherein, at the end of a first and second series of excitation sequences, a first image and second image are acquired, a characteristic of the experiment being modified during the second series of the excitation sequence, the molecular diffusion parameters being deduced in a third image of point-to-point comparisons of the first two images.

7. A method to measure the perfusion parameters of a live and resting tissue of a patient using an NMR experiment, comprising at least one series of radio-frequency excitation sequences of said tissue, each sequence being followed by measurements of a NMR signal resulting from said excitations, said NMR signals being then processed for giving said perfusion parameters, wherein the excitations are synchronized with the heart beat of the patient.

8. A method to measure the molecular diffusion and perfusion parameters of a live and resting tissue of a patient using an NMR experiment, comprising at least one series of radio-frequency excitation sequences of said tissue, each sequence being followed by measurements of a NMR signal resulting from said excitations, said NMR signals being then processed for giving said parameters, wherein the excitations are synchronized with the heart beat of the patient.

* * * * *